(12) United States Patent
Nakayama et al.

(10) Patent No.: US 10,438,866 B2
(45) Date of Patent: Oct. 8, 2019

(54) INSULATING SHEET AND MANUFACTURING METHOD FOR SAME

(71) Applicant: Panasonic Intellectual Property Management Co., Ltd., Osaka (JP)

(72) Inventors: Masafumi Nakayama, Hokkaido (JP); Yoshiya Sakaguchi, Kyoto (JP); Hirofumi Yamada, Hokkaido (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 560 days.

(21) Appl. No.: 14/778,138

(22) PCT Filed: Jan. 8, 2014

(86) PCT No.: PCT/JP2014/000023
§ 371 (c)(1),
(2) Date: Sep. 18, 2015

(87) PCT Pub. No.: WO2014/155898
PCT Pub. Date: Oct. 2, 2014

(65) Prior Publication Data
US 2016/0172270 A1    Jun. 16, 2016

(30) Foreign Application Priority Data

Mar. 25, 2013  (JP) .................................. 2013-061412

(51) Int. Cl.
*B32B 27/40* (2006.01)
*B32B 37/06* (2006.01)
(Continued)

(52) U.S. Cl.
CPC ............ *H01L 23/4275* (2013.01); *B32B 5/16* (2013.01); *B32B 7/12* (2013.01); *B32B 9/007* (2013.01);
(Continued)

(58) Field of Classification Search
CPC . B32B 2607/00; B32B 2419/00; B32B 27/40; B32B 15/08–15/098;
(Continued)

(56) References Cited

U.S. PATENT DOCUMENTS 5,804,297 A * 9/1998 Colvin ...................... C09K 5/06
428/327
2007/0166521 A1 * 7/2007 Lefebvre ................. B32B 15/08
428/212

(Continued)

FOREIGN PATENT DOCUMENTS

EP          1232856 A1 *  8/2002  ............. B32B 27/08
JP       2001-248987         9/2001
(Continued)

OTHER PUBLICATIONS

Thermal Conductivity of Metals, The Engineering Tool Box, www.EngineeringToolBox.com, downloaded from https://www.engineeringtoolbox.com/thermal-conductivity-metals-d_858.html on Jul. 19, 2018. (Year: 2018).*
(Continued)

*Primary Examiner* — Monique R Jackson
(74) *Attorney, Agent, or Firm* — McDermott Will & Emery LLP

(57) ABSTRACT

A heat-insulating sheet includes a heat storage sheet, a first insulating sheet, and a thermally conductive sheet. The heat storage sheet contains a first resin and a plurality of microcapsules containing latent heat storage material and mixed in the form of aggregates with each other. The first insulating sheet has a first face bonded to the heat storage sheet and a second face opposite to the first face. The thermally conductive sheet is bonded to the second face of the first insulating sheet. The content of the microcapsules in the heat storage sheet is falls within a range from 40 wt % to 90 wt %, inclusive. The heat storage sheet includes a layer free (Continued)

from the microcapsules at a portion in contact with the first insulating sheet.

9 Claims, 3 Drawing Sheets

(51) Int. Cl.
| | | |
|---|---|---|
| B32B 37/24 | (2006.01) | |
| B32B 5/16 | (2006.01) | |
| B32B 7/12 | (2006.01) | |
| F16L 59/02 | (2006.01) | |
| H01L 23/427 | (2006.01) | |
| B32B 9/04 | (2006.01) | |
| B32B 27/28 | (2006.01) | |
| B32B 33/00 | (2006.01) | |
| B32B 9/00 | (2006.01) | |
| B32B 15/09 | (2006.01) | |
| B32B 15/20 | (2006.01) | |
| B32B 27/14 | (2006.01) | |
| B32B 27/16 | (2006.01) | |
| B32B 27/36 | (2006.01) | |
| B32B 37/14 | (2006.01) | |

(52) U.S. Cl.
CPC .............. *B32B 9/045* (2013.01); *B32B 15/09* (2013.01); *B32B 15/20* (2013.01); *B32B 27/14* (2013.01); *B32B 27/16* (2013.01); *B32B 27/28* (2013.01); *B32B 27/36* (2013.01); *B32B 27/40* (2013.01); *B32B 33/00* (2013.01); *B32B 37/06* (2013.01); *B32B 37/24* (2013.01); *F16L 59/026* (2013.01); *B32B 37/142* (2013.01); *B32B 2037/243* (2013.01); *B32B 2255/10* (2013.01); *B32B 2255/26* (2013.01); *B32B 2260/025* (2013.01); *B32B 2260/046* (2013.01); *B32B 2264/00* (2013.01); *B32B 2264/0214* (2013.01); *B32B 2305/72* (2013.01); *B32B 2307/302* (2013.01); *B32B 2307/304* (2013.01); *B32B 2307/732* (2013.01); *B32B 2457/00* (2013.01); *H01L 2924/0002* (2013.01)

(58) Field of Classification Search
CPC ............ B32B 2255/10; B32B 2255/26; B32B 2307/304; C09J 7/22; C09J 7/255; C09J 2201/606; H01L 23/427; H01L 23/4275
See application file for complete search history.

(56) References Cited

U.S. PATENT DOCUMENTS

| | | | |
|---|---|---|---|
| 2009/0148575 A1* | 6/2009 | Lang-Wittkowski | ........................ C09D 7/1283 426/392 |
| 2010/0264353 A1* | 10/2010 | Hartmann | ............... C08B 15/02 252/62 |
| 2010/0316816 A1* | 12/2010 | Husemann | .............. B32B 27/08 428/1.5 |
| 2010/0316821 A1* | 12/2010 | Chang | ................. B29C 47/0021 428/35.8 |
| 2011/0247215 A1* | 10/2011 | Schmidt | .................... B32B 5/18 29/897.3 |
| 2012/0141786 A1* | 6/2012 | Uh | ..................... C08G 18/6254 428/343 |

FOREIGN PATENT DOCUMENTS

| | | |
|---|---|---|
| JP | 2008-516413 | 5/2008 |
| JP | 2008-291083 | 12/2008 |
| JP | 2009-123769 A | 6/2009 |
| JP | 2010-251463 | 11/2010 |
| JP | 2012-087182 | 5/2012 |
| WO | 2005/048298 | 5/2005 |

OTHER PUBLICATIONS

MPCM 43D, Product Information, 2017, Microtek Laboratories, Inc., downloaded from www.microteklabs.com. (Year: 2017).*

Sphere packing, Wikipedia.org, retrieved on Feb. 3, 2019 from "https://en.wikipedia.org/w/index.php?title=Sphere_packing&oldid=872839575". (Year: 2019).*

Close-packing of equal spheres, Wikipedia.org, retrieved on Feb. 3, 2019 from "https://en.wikipedia.org/w/index.php?title=Close-packing_of_equal_spheres&oldid=868889610". (Year: 2019).*

International Search Report of PCT application No. PCT/JP2014/000023 dated Mar. 18, 2014.

English Translation of Chinese Search Report dated Sep. 28, 207 for the related Chinese Patent Application No. 201480017491.9.

* cited by examiner

INSULATING SHEET AND MANUFACTURING METHOD FOR SAME

TECHNICAL FIELD

The present invention relates to a heat-insulating sheet that reduces or delays the propagation of heat generated in a heat-generating component to the outside and also prevents a rapid temperature rise in the component. The invention further relates to a method of manufacturing the sheet.

BACKGROUND ART

With the increasing sophistication of electronic devices in recent years, ICs and other heat-generating components generate more heat, often causing the casings of the devices or the ICs to overheat, resulting in reduction in the operation speed of the ICs. To overcome such problems, a highly heat-conductive member such as a graphite sheet is placed in contact with the ICs so as to diffuse the generated heat.

The above approach can handle a certain degree of heat, but not too much heat generated instantaneously. For example, electronic devices that download a large amount of data generate heat promptly during download. It is absolutely necessary to prevent a temporary temperature rise caused by the heat generated during download, which does not generally take much time.

An example of conventional techniques related to the present invention is shown in Patent Literature 1.

CITATION LIST

Patent Literature

PTL1: Japanese Translation of PCT Publication No. 2008-516413

SUMMARY OF THE INVENTION

An object of the present invention is to provide a heat-insulating sheet that reduces or delays the propagation of heat generated in a heat-generating component to the outside and also prevents a rapid temperature rise in the component.

The heat-insulating sheet according to the present invention, which has been developed to solve the aforementioned conventional problems, includes a heat storage sheet, a first insulating sheet, and a thermally conductive sheet. The heat storage sheet contains a first resin and a plurality of microcapsules containing latent heat storage material and mixed in the form of aggregates with each other. The first insulating sheet has a first face bonded to the heat storage sheet and a second face opposite to the first face. The thermally conductive sheet is bonded to the second face of the first insulating sheet. The content of the microcapsules in the heat storage sheet falls in a range from 40 wt % to 90 wt %, inclusive. The heat storage sheet includes a layer free from the microcapsules at a portion in contact with the first insulating sheet. This configuration reduces or delays the propagation of heat generated in the heat-generating component to the outside and also prevents a rapid temperature rise in the component. Also according to the configuration, the heat storage sheet is connected to the thermally conductive sheet stably, so that the heat diffused by the thermally conductive sheet is efficiently propagated to the heat storage sheet. Thus, the heat generated in the heat-generating component is diffused by the thermally conductive sheet, then propagated to the heat storage sheet, and finally consumed to melt the latent heat storage material when reaching a predetermined temperature. This results in a delay in the temperature rise of the heat-generating component.

DESCRIPTION OF EMBODIMENT

Figure 1:
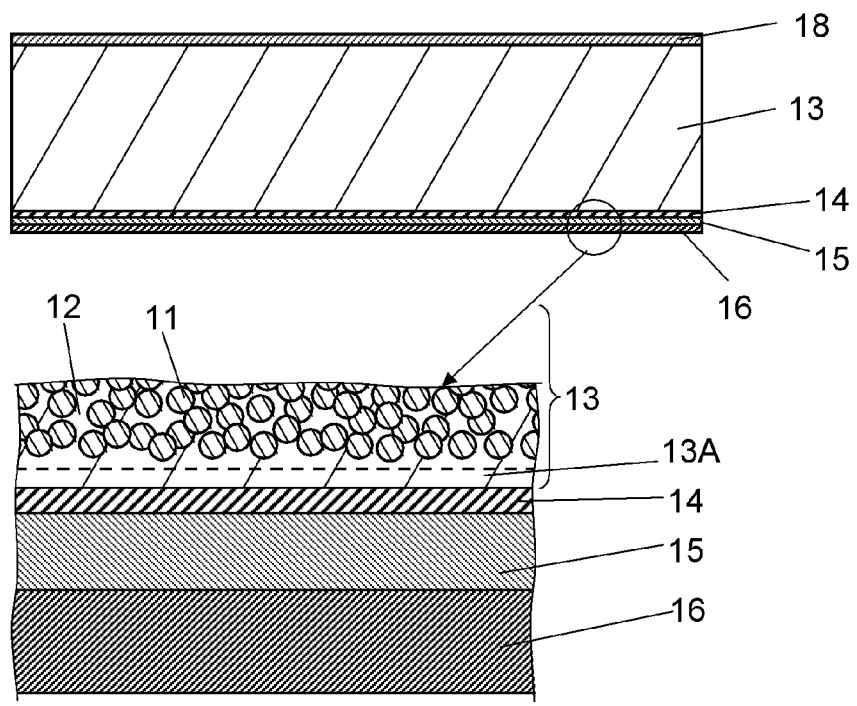
FIG. 1 shows sectional views of a heat-insulating sheet according to an exemplary embodiment of the present invention.

FIG. 1 shows sectional views of a heat-insulating sheet according to an exemplary embodiment of the present invention.

The heat-insulating sheet includes heat storage sheet 13, first insulating sheet 14, and thermally conductive sheet 15. Heat storage sheet 13 is formed of a mixture of first resin 12 and microcapsules 11 containing latent heat storage material into a sheet shape. Microcapsules 11 are particles made by encapsulating the latent heat storage material in capsules formed of formalin resin and have diameters of 1 to 3 μm. The latent heat storage material is paraffin with a melting point of about 39° C. The spherical capsules agglutinate to form aggregates with a size of about 50 μm and microcapsules 11 are in the form of powder. Microcapsules 11 are mixed with first resin 12 and the mixture is formed into a sheet shape, so that heat storage sheet 13 with a thickness of about 0.6 mm is prepared. First resin 12 can be urethane resin, which allows a large amount of microcapsules 11 to be mixed together without being broken, and also allows heat storage sheet 13 to be flexible.

The content of microcapsules 11 in heat storage sheet 13 is, for example, about 70 wt %. The performance of heat storage sheet 13 improves with increasing content of microcapsules 11; however, when the content exceeds 90 wt %, it becomes difficult to knead them with first resin 12 and consequently to maintain the strength and shape of sheet 13. In contrast, when the content of microcapsules 11 is less than 40 wt %, the aggregates of microcapsules 11 float separately in first resin 12. In this case, the thermal conductivity is too low to allow heat storage sheet 13 to exhibit its performance. When the content is 40% or more, the aggregates of microcapsules 11 are in contact with each other, allowing heat to be quickly propagated throughout heat storage sheet 13. Hence, the content of microcapsules 11 in heat storage sheet 13 is preferably not less than 40 wt % and not more than 90 wt %, and more preferably not less than 50 wt % and not more than 90 wt %.

Heat storage sheet 13 is bonded, on one face, to a first face of first insulating sheet 14, which is made, for example, of polyethylene terephthalate (hereinafter, PET) with a thickness of about 10 μm. First insulating sheet 14 is bonded, on a second face opposite to the first face of first insulating sheet 14, to thermally conductive sheet 15 via an adhesive made of acrylic resin. Sheet 15 can be a pyrolytic graphite sheet with a thickness of about 25 μm, or alternatively be a copper film, an aluminum film, etc. The use of these sheets with a thermal conductivity of 100 W/m·K or more at least in the surface direction enhances the effects of the present invention. The pyrolytic graphite sheet has a thermal conductivity of about 1600 W/m·K in the surface direction, which is much higher than those of the above-mentioned metal films in the surface direction. Moreover, the graphite sheet excels in flexibility, thus is preferable.

Heat storage sheet 13 includes layer 13A with a thickness of 5 to 10 μm and not containing microcapsules 11, in a portion in contact with first insulating sheet 14. In short, layer 13A is made of only urethane resin and therefore has a good adhesion with first insulating sheet 14. Furthermore, the first face, which is in contact with heat storage sheet 13, of first insulating sheet 14 is preferably polarized to improve the bonding strength between sheets 13 and 14. For polarization of first insulating sheet 14, corona treatment on first insulating sheet 14 is applicable so as to form polar groups such as hydroxyl groups and carboxyl groups.

It is preferable to bond second insulating sheet 16 onto a second face, which is opposite to a first face to be bonded to heat storage sheet 13, of thermally conductive sheet 15. Second insulating sheet 16 protects thermally conductive sheet 15 during handling. Sheet 16 can be a double-sided adhesive tape, which allows thermally conductive sheet 15 to be tightly contact to the heat-generating component and hence to exhibit higher performance. It is further possible to bond third insulating sheet 18 onto the face, which is opposite to the face bonded to first insulating sheet 14, of heat storage sheet 13. Third insulating sheet 18 protects heat storage sheet 13.

A combined sheet of heat storage sheet 13 and first insulating sheet 14 stands for a sheet in a condition of bonding heat storage sheet 13 and first insulating sheet 14 together, and can be achieved by different approaches: for example, sheet 13 can be formed first, and then bonded to sheet 14, or can be formed on sheet 14.

Figure 2:
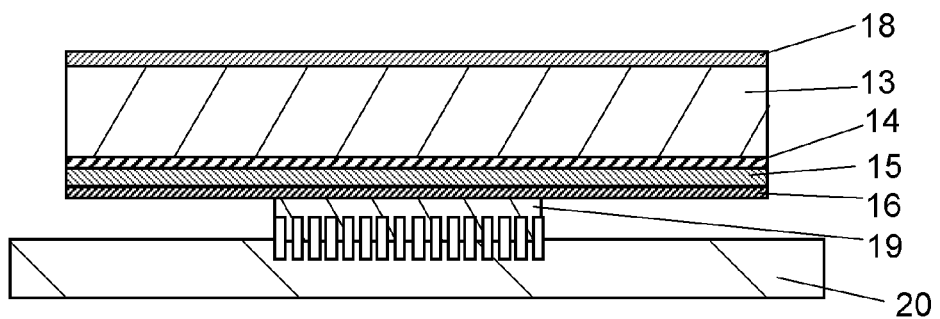
FIG. 2 shows an example of use of the heat-insulating sheet according to the exemplary embodiment of the present invention.

FIG. 2 is a sectional view of an example of use of the heat-insulating sheet according to the exemplary embodiment. In the heat-insulating sheet of this example, the thermally conductive sheet 15 side of the heat-insulating sheet is in contact, via second insulating sheet 16, with heat-generating component 19 such as an IC mounted on substrate 20 or with a casing which accommodates component 19. If heat-generating component 19 is bonded to heat storage sheet 13, heat would propagate only to that area of sheet 13 which is in the vicinity of component 19 because of the poor thermal conductivity of sheet 13. In contrast, in the exemplary embodiment, the heat generated in component 19 is propagated to thermally conductive sheet 15 and diffused in the surface direction. The entire area of sheet 15 is firmly bonded to heat storage sheet 13, allowing the heat to smoothly propagate throughout sheet 13. The heat that has propagated throughout sheet 13 is consumed to melt the latent heat storage material when reaching a predetermined temperature, thereby delaying the temperature rise. This can absorb and diffuse heat generated rapidly, especially during download.

The exemplary embodiment uses a single kind of latent heat storage material with a melting point of about 39° C. Alternatively, heat storage sheet 13 may be formed by mixing first resin 12 with microcapsules containing latent heat storage material having a melting point of about 39° C., and those containing latent heat storage material having a melting point of about 60° C., for example. This can further prevent a rapid temperature rise in heat-generating component 19.

A method of manufacturing the heat-insulating sheet according to the exemplary embodiment of the present invention will now be described with reference to FIGS. 3A to 3C.

Figure 3A:
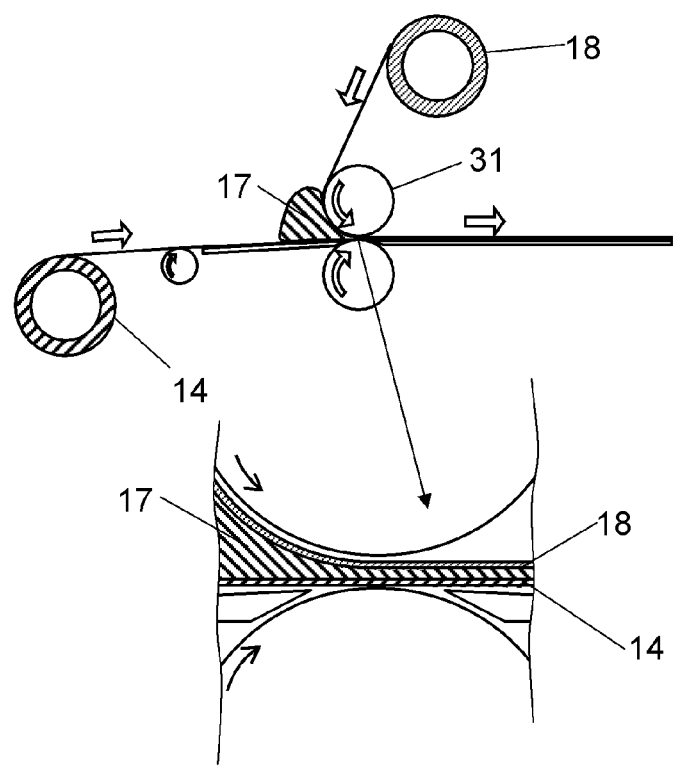
FIG. 3A shows explanatory drawings of a sheet-forming procedure in a method of manufacturing the heat-insulating sheet according to the exemplary embodiment of the present invention.
Figure 3B:
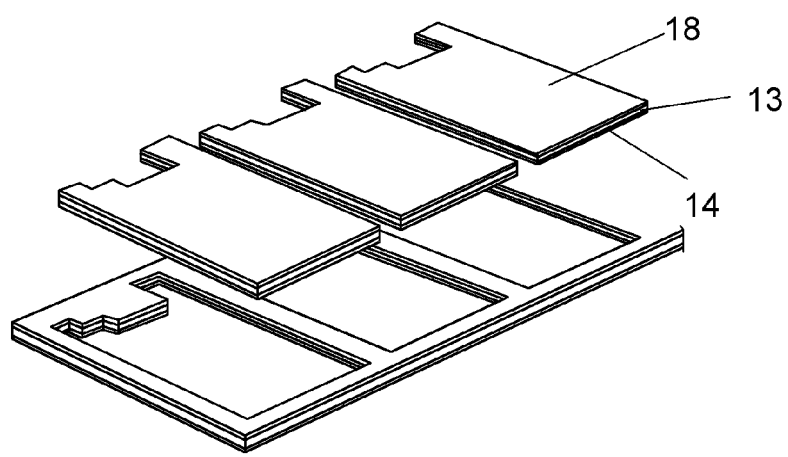
FIG. 3B is a perspective view of heat-insulating sheets that are cut into shape after the procedure of FIG. 3A.
Figure 3C:
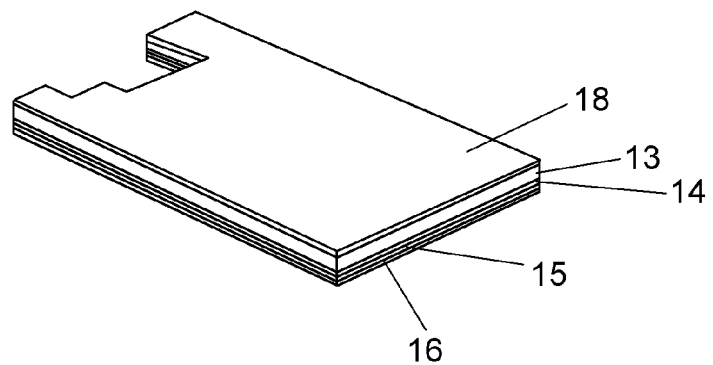
FIG. 3C is a perspective view of a heat-insulating sheet obtained by the method of manufacturing the heat-insulating sheet according to the exemplary embodiment of the present invention.

First, microcapsules 11 are mixed with uncured first resin 12 into paste 17 used for the heat storage sheet shown in FIG. 3A. Microcapsules 11 are particles made of formalin resin and have diameters of 1 to 3 μm. The latent heat storage material contained in microcapsules 11 is paraffin with a melting point of about 39° C. Spherical microcapsules 11 agglutinate to form aggregates with a size of about 50 μm.

As first resin 12, urethane resin is used. Before being cured, the urethane resin contains a base resin and a hardening agent. After being cured, the urethane resin has a depth of penetration preferably not less than 50 and not more than 250, and more preferably not less than 80 and not more than 180. The depth of penetration can be measured according to ASTM D5 or JIS K2207, by using, for example, an automatic penetrometer RPM-2011 available from Rigo Co., Ltd. Urethane resin generally has a depth of penetration of 20 or less, but when the resin is cured together with such a large amount of microcapsules 11, the resulting mixture becomes too brittle to be kept as a sheet form. The mixture is too weak to be kept as a sheet form also when the depth of penetration is very large. In contrast, the resin used in the exemplary embodiment has a depth of penetration of not less than 50 and not more than 250, so that the mixture can be formed into a sheet even when the content of microcapsules 11 is 40 wt % or more.

In the exemplary embodiment, the content of microcapsules 11 is approximately 70 wt % and that of first resin 12 is approximately 30 wt % in paste 17 used for the heat storage sheet.

Next, paste 17 is applied between first insulating sheet 14 and third insulating sheet 18 and inserted between rollers 31 of a roll forming machine as shown in FIG. 3A, thereby being formed into a sheet about 0.6 mm thick.

As first insulating sheet 14, a PET film about 10 μm thick is used. One face (the first face) of sheet 14, on which heat storage sheet 13 is formed, is polarized by corona treatment so as to form polar groups such as hydroxyl groups or carboxyl groups on the face. The face is also roughened. As a result, the face, on which sheet 13 is to be formed, of sheet 14 has high wettability, allowing first resin 12 contained in sheet 13 to be highly wettable to sheet 14. Because of this wettability, sheet 13 includes, on a face in contact with sheet 14, layer 13A with a thickness of 5 to 10 μm thick and free from the microcapsules. As a result, the bonding strength and thermal conductivity between sheets 13 and 14 can be improved when first resin 12 is cured.

In FIG. 3A, heat storage sheet 13 is disposed between sheets 14 and 18, but may alternatively be disposed on the first face of sheet 14 without providing sheet 18.

As third insulating sheet 18, the same PET film about 10 μm thick as that used for first insulating sheet 14 can be used and functions as a protective film in the end. Alternatively, sheet 18 can be a mold-release film and be removed to expose heat storage sheet 13 after mounting the heat-insulating sheet. Exposing heat storage sheet 13 can improve the radiation performance of the heat-insulating sheet.

Next, a laminate of sheets 13 and 14 is put into a dryer at about 90° C. for about 20 hours, thereby curing first resin 12 contained in sheet 13. The resulting body is cut into a predetermined shape using a die so as to obtain the cured body shown in FIG. 3B.

Next, thermally conductive sheet 15 is bonded to the second face, which is opposite to the first face on which heat storage sheet 13 is formed, of first insulating sheet 14. As a result, the heat-insulating sheet shown in FIG. 3C is obtained. As thermally conductive sheet 15, a pyrolytic graphite sheet about 25 µm thick is used, and is bonded to first insulating sheet 14 via the double-sided adhesive tape applied to this face of sheet 15.

It is preferable to additionally provide second insulating sheet 16 on the face, which is opposite to the face to be bonded to sheet 13, of thermally conductive sheet 15. This configuration can be easily achieved by previously bonding second insulating sheet 16 to the face, which is opposite to the face to be bonded to sheet 13, of thermally conductive sheet 15. Second insulating sheet 16 protects thermally conductive sheet 15 during handling. Sheet 16 can be a double-sided adhesive tape, which allows thermally conductive sheet 15 to be more tightly contact with heat-generating component 19 and hence to exhibit higher performance of thermally conductive sheet 15.

INDUSTRIAL APPLICABILITY

The heat-insulating sheet of the present invention is industrially useful because it reduces or delays the propagation of heat generated in the heat-generating component to the outside and also prevents a rapid temperature rise in the heat-generating component.

REFERENCE MARKS IN THE DRAWINGS 11 microcapsule
12 first resin
13 heat storage sheet
13A layer free from microcapsules
14 first insulating sheet
15 thermally conductive sheet
16 second insulating sheet
17 paste for heat storage sheet
18 third insulating sheet
19 heat-generating component
20 substrate
31 roller

The invention claimed is:

1. A heat-insulating sheet comprising:
a heat storage sheet containing:
  a cured urethane resin; and
  a plurality of microcapsules containing latent heat storage material and mixed in a form of aggregates with each other,
a first insulating sheet having a first face bonded to the heat storage sheet and a second face opposite to the first side; and
a thermally conductive sheet bonded to the second face of the first insulating sheet,
wherein a content of the microcapsules in the heat storage sheet falls within a range from 40 wt % to 90 wt %, inclusive,
the heat storage sheet includes a layer free from the microcapsules at a portion in contact with the first insulating sheet,
the aggregates of microcapsules are in contact with one another,
the heat storage sheet is made of the cured urethane resin having a hardened material, and
a hardness evaluation according to ASTM D5 proves that a degree of needle penetration into the cured urethane resin falls within a range of 50-250 inclusive.

2. The heat-insulating sheet according to claim 1, wherein the first face of the first insulating sheet is polarized.

3. The heat-insulating sheet according to claim 1, wherein the thermally conductive sheet has a thermal conductivity of at least 100 W/m·K in a surface direction.

4. The heat-insulating sheet according to claim 1, wherein a thickness of the layer free from the microcapsules falls within a range from 5 µm to 10 µm.

5. A heat-insulating sheet comprising:
a heat storage sheet containing:
  a cured urethane resin; and
  a plurality of microcapsules containing latent heat storage material and mixed in a form of aggregates with each other,
a first insulating sheet having a first face bonded to the heat storage sheet and a second face opposite to the first side; and
a thermally conductive sheet bonded to the second face of the first insulating sheet,
wherein a content of the microcapsules in the heat storage sheet falls within a range from 40 wt % to 90 wt %, inclusive,
the heat storage sheet includes a layer free from the microcapsules at a portion in contact with the first insulating sheet,
the first face of the first insulating sheet is roughened,
the aggregates of microcapsules are in contact with one another,
the heat storage sheet is made of the cured urethane resin having a hardened material, and
a hardness evaluation according to ASTM D5 proves that a degree of needle penetration into the cured urethane resin falls within a range of 50-250 inclusive.

6. A method of manufacturing a heat-insulating sheet, comprising:
preparing a paste used for a heat storage sheet by mixing an uncured urethane resin and hardening agent with a plurality of microcapsules in a form of aggregates and containing latent heat storage material in such a manner that a content of the microcapsules in the heat storage sheet is in a range from 40 wt % to 90 wt %, inclusive;
forming a heat storage sheet by applying the paste to a first face of a first insulating sheet;
curing the uncured urethane resin by heating the heat storage sheet; and
bonding a thermally conductive sheet to a second face opposite to the first face of the first insulating sheet,
wherein the first face of the first insulating sheet is more wettable than an inside of the first insulating sheet with respect to the uncured urethane resin,
a layer free from the microcapsules is formed in the heat storage sheet at a portion in contact with the first insulating sheet,
the aggregates of microcapsules are in contact with one another,
the heat storage sheet is made of the cured urethane resin having a hardened material, and
a hardness evaluation according to ASTM D5 proves that a degree of needle penetration into the cured urethane resin falls within a range of 50-250 inclusive.

7. The method according to claim 6, wherein the first face of the first insulating sheet is polarized by corona treatment.

8. The method according to claim 6, wherein the thermally conductive sheet has a thermal conductivity of at least 100 W/m·K in a surface direction.

9. The method according to claim 6, wherein a thickness of the layer free from the microcapsules falls within a range from 5 μm to 10 μm.

* * * * *